United States Patent
Wang

(10) Patent No.: US 8,287,955 B2
(45) Date of Patent: Oct. 16, 2012

(54) COATING METHOD FOR FORMING PATTERN ON WORKPIECE

(75) Inventor: Chung-Pei Wang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/977,076

(22) Filed: Dec. 23, 2010

(65) Prior Publication Data

US 2012/0040096 A1 Feb. 16, 2012

(30) Foreign Application Priority Data

Aug. 13, 2010 (TW) .............................. 99127030 A

(51) Int. Cl.
*C23C 16/04* (2006.01)
*C23C 14/34* (2006.01)

(52) U.S. Cl. ..................... 427/248.1; 427/272; 427/282; 204/192.1

(58) Field of Classification Search ............... 427/248.1, 427/272, 282; 204/192.1
See application file for complete search history.

(56) References Cited

U.S. PATENT DOCUMENTS

| 5,863,411 A * | 1/1999 | Kang et al. ..................... 205/645 |
| 2002/0133925 A1* | 9/2002 | Nishimura et al. ............ 29/25.35 |
| 2004/0142625 A1* | 7/2004 | Freeman et al. ................ 445/60 |
| 2005/0088785 A1* | 4/2005 | Chang et al. .................. 360/317 |
| 2006/0148386 A1* | 7/2006 | Ueda et al. ...................... 451/63 |
| 2007/0004100 A1* | 1/2007 | Maekawa et al. ............. 438/149 |
| 2009/0170227 A1* | 7/2009 | Yamazaki et al. ............. 438/26 |

FOREIGN PATENT DOCUMENTS

JP 2007-268689 * 10/2007

OTHER PUBLICATIONS

Ingino, J., et al., "Workpiece charging in electron beam lithography". J. Vac. Sci. Technol. B 12(3), May/Jun. 1994, pp. 1367-1371.*
Mori, T., et al., "Clarification of magnetic abrasive finishing mechanism". Journal of Materials Processing Technology 143-144 (2003) pp. 682-686.*

* cited by examiner

*Primary Examiner* — Bret Chen
(74) *Attorney, Agent, or Firm* — Altis Law Group, Inc.

(57) ABSTRACT

A coating method for forming a pattern on a workpiece is provided. The method includes the follow steps: providing a workpiece having a surface, forming a coating layer over the surface using a physical vapor deposition method; providing a mask having a shape conforming to a predetermined pattern; attaching the mask to the surface such that a portion of the coating layer is shielded. The coating layer consists of a shielded portion and an unwanted portion surrounding the shielded portion. Finally, removing the unwanted portion of the coating layer using a magnetic abrasive finishing method, and removing the mask to obtain the shielded portion having the predetermined pattern on the workpiece.

17 Claims, 3 Drawing Sheets

COATING METHOD FOR FORMING PATTERN ON WORKPIECE

BACKGROUND

1. Technical Field

The present disclosure relates to coating methods, and particularly to a coating method for forming a pattern on a workpiece, for example, a case of mobile phone.

2. Description of Related Art

Metal or metal oxide coatings can be applied to a predetermined area of a workpiece by physical vapor deposition (PVD) methods or chemical vapor deposition (CVD) methods. A shielding sheet covers the non-predetermined area so that the metal or metal oxide materials will be only coated on the predetermined area. However, the disadvantage of using PVD or CVD methods only is that the shielding sheet is usually too thick; some of the metal or metal oxide coating may get deposited on the edges of the shielding sheet and on the edges of the predetermined area. Therefore, the edges of the predetermined area may be blurred, and the thickness of the coat may not be uniform.

What is needed, therefore, is a coating method for forming a pattern on a workpiece, which can overcome the above shortcomings.

BRIEF DESCRIPTION OF THE DRAWINGS

Many aspects of the present coating method for forming a pattern on a workpiece can be better understood with reference to the following drawings. The components in the drawings are not necessarily drawn to scale, the emphasis instead being placed upon clearly illustrating the principles of the present coating method for forming patterns. Moreover, in the drawings, like reference numerals designate corresponding parts throughout the views.

DETAILED DESCRIPTION

Figure 1:
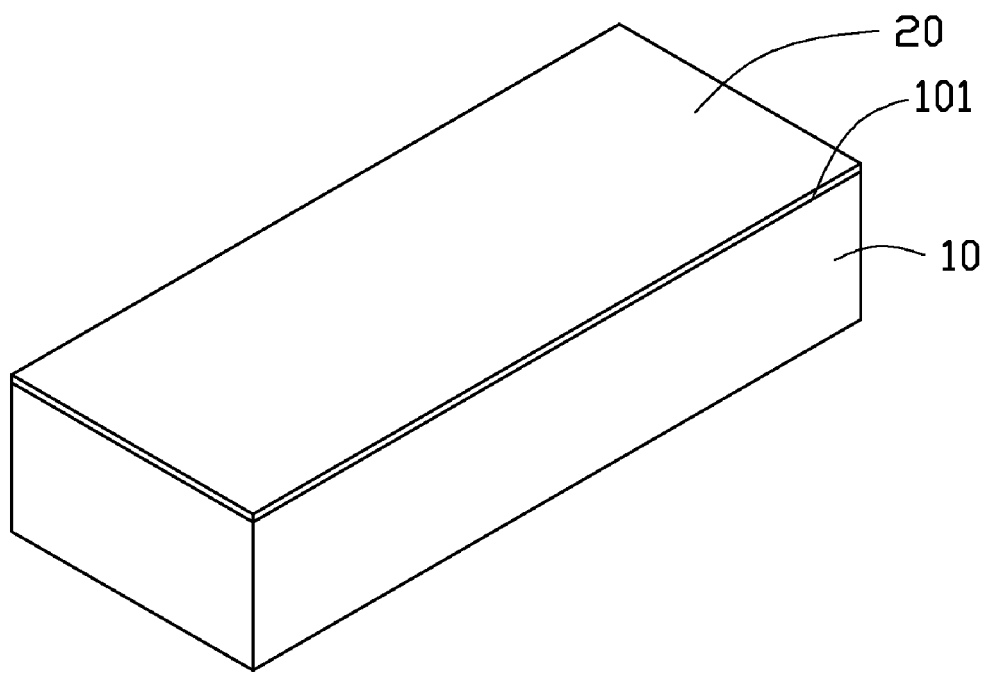
FIG. 1 is a schematic view of a workpiece coated with a coating layer.
Figure 3:
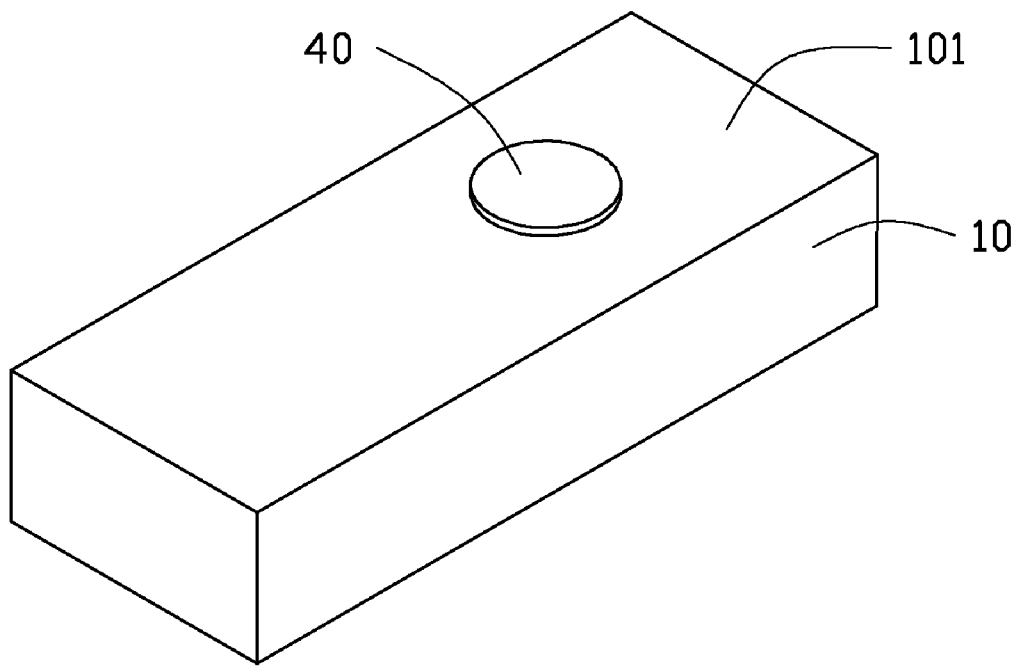
FIG. 3 is similar to FIG. 2, but showing that an unwanted portion of the coating layer is removed.

Referring to FIG. 1, a workpiece 10 constituting an external surface 101 is subjected to a coating step. In the present embodiment, the workpiece 10 is a case of an electronic device, such as the case of a mobile phone. The workpiece 10 is made of ferromagnetic materials, for example iron, nickel, or cobalt. The surface 101 is flat. A predetermined pattern 40 (shown in FIG. 3) will be formed on the surface 101. The predetermined pattern 40 may be a logo, or a trademark. The area of the predetermined pattern 40 is smaller than that of the surface 101. The predetermined pattern 40 in this embodiment is a circular shape.

In a first step, a coating layer 20 is deposited over the entire flat surface 101. The coating layer 20 may be coated on the surface 101 by a PVD method. The coating layer 20 may be a single layer film or a multilayer film. The material of the coating layer 20 may be metallic, for example, metal, or metal oxide. The coating layer 20 may be also made of plastic.

Figure 2:
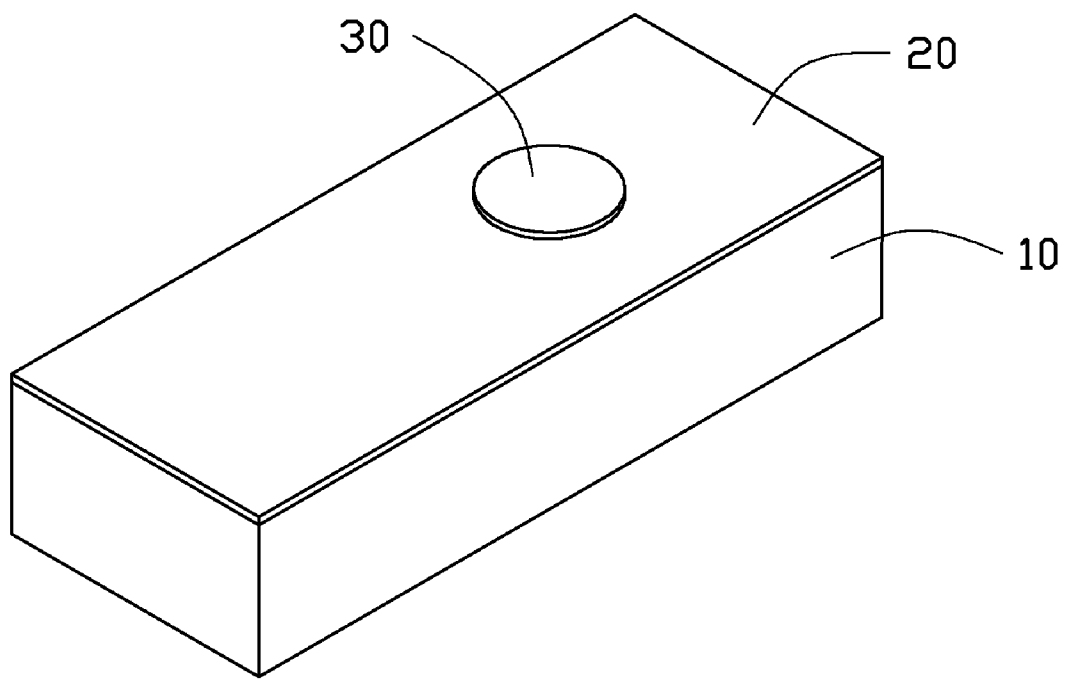
FIG. 2 is similar to FIG. 1, but showing a mask attached on the coating layer.

In a second step, referring to FIG. 2, a mask 30 is applied to the coating layer 20. The form of the mask 30 conforms to the shape of the predetermined pattern 40. The mask 30 shields the portion of the surface 101 where the predetermined pattern 40 will be located, leaving an exposed portion of the coating layer 20 to be removed. The mask 30 is made of magnetic materials, and may for example be a magnet, or a permanent magnet. Because the workpiece 10 is made of ferromagnetic materials, it is easy to attach the mask 30 to the workpiece 10 firmly. Thus, the coating layer 20 consists of a shielded portion and an exposed portion surrounding the shielded portion.

In a third step, the coating layer 20 over the exposed portion is removed by magnetic abrasive finishing (MAF) process. In detail, the workpiece 10 is put into a receiver having a magnetic field produced by two magnetic poles (not shown). Some magnetic abrasive materials are located between the workpiece 10 and the magnetic poles. These magnetic abrasive materials will remove the exposed portion of the coating layer 20 like a brush under precise control.

After the exposed portion of the coating layer 20 is removed, the mask 30 may be removed. The predetermined pattern 40 formed by the shielded portion of the coating layer 20 thus is shown up.

Before removing the mask 30, a part of the surface 101 is exposed due to the removed exposed coating layer 20. This part of the surface 101 may be polished by some known tool or methods in order to obtain an appealing appearance.

The predetermined pattern 40 is formed actually in the first step of coating the coating layer 20. Because the coating layer 20 is coated on the entire surface 101, the thickness of the coating layer 20 is uniform, that is, the thickness of the predetermined pattern 40 is uniform. The area of the predetermined pattern 40 is kept protected by the mask 30, so the predetermined pattern 40 will not be destroyed or influenced by other procedures. The predetermined pattern 30 may be modified after the mask 30 is removed.

It is understood that the above-described embodiments are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. A coating method for forming a pattern on a workpiece, the method comprising:
   providing a workpiece having a surface, the workpiece comprising a ferromagnetic material;
   forming a coating layer over the surface using a physical vapor deposition method;
   providing a mask having a shape conforming to a predetermined pattern, the mask comprising a magnetic material;
   attaching the mask to a surface of the coating layer that is opposite to the surface of the workpiece such that the workpiece and the mask are attracted together by magnetic forces between the mask and the workpiece, wherein the surface of the coating layer comprises a shielded portion that is covered by the mask and an exposed portion surrounding the shielded portion;
   removing the exposed portion of the coating layer using a magnetic abrasive finishing process; and
   removing the mask to obtain the shielded portion having the predetermined pattern on the workpiece.

2. The method according to claim 1, wherein portions of the surface of the workpiece are exposed due to removal of the exposed portion of the coating layer, and the exposed portions of the surface of the workpiece are polished prior to removing the mask.

3. The method according to claim 1, wherein the coating layer is comprised of metallic material.

4. The method according to claim 1, wherein the coating layer is a multilayer film.

5. The method according to claim 1, wherein the mask is made of magnetic materials.

6. The method according to claim 5, wherein the mask is a magnet or a permanent magnet.

7. The method according to claim 1, wherein the surface of the workpiece is flat.

8. The method according to claim 7, wherein the thickness of the coating layer is uniform, and the step of removing the exposed portion of the coating layer using a magnetic abrasive finishing process comprises:
   putting the workpiece into a receiver having a magnetic field produced by two magnetic poles; and
   placing magnetic abrasive materials between the workpiece and the magnetic poles;
   wherein the magnetic abrasive materials remove the exposed portion of the coating layer under control of the magnetic field.

9. The method according to claim 1, wherein the coating layer being made of plastic.

10. A coating method for forming a pattern on a workpiece, the method comprising:
   providing a workpiece having a surface;
   forming a coating layer over the surface using a physical vapor deposition method;
   providing a mask having a shape conforming to a predetermined pattern;
   magnetizing the workpiece or the mask using a magnetic field;
   attaching the mask to a surface of the coating layer that is opposite to the surface of the workpiece such that the workpiece and the mask are attracted together by magnetic forces between the mask and the workpiece, wherein the surface of the coating layer comprises a shielded portion that is covered by the mask and an exposed portion surrounding the shielded portion;
   removing the exposed portion of the coating layer using a magnetic abrasive finishing process; and
   removing the mask to obtain the shielded portion having the predetermined pattern on the workpiece.

11. The method according to claim 10, wherein the coating layer is made of plastic.

12. The method according to claim 11, wherein the coating layer is a multilayer film.

13. The method according to claim 11, wherein the mask is made of magnetic materials.

14. The method according to claim 13, wherein the mask is a magnet or a permanent magnet.

15. The method according to claim 11, wherein if the workpiece is magnetized by the magnetic field, the magnetism of the workpiece disappears when the magnetic field is removed.

16. The method according to claim 11, wherein if the mask is magnetized by the magnetic field, the magnetism of the mask disappears when the magnetic field is removed.

17. The method according to claim 10, wherein the coating layer is comprised of metallic material.

* * * * *